United States Patent
Padmanabhan et al.

(10) Patent No.: US 10,658,351 B2
(45) Date of Patent: May 19, 2020

(54) ELECTRONIC DEVICE INCLUDING A TRANSISTOR HAVING STRUCTURES WITH DIFFERENT CHARACTERISTICS

(71) Applicant: SEMICONDUCTOR COMPONENTS INDUSTRIES, LLC, Phoenix, AZ (US)

(72) Inventors: Balaji Padmanabhan, Scottsdale, AZ (US); Kirk K. Huang, Chandler, AZ (US); Prasad Venkatraman, Gilbert, AZ (US); Emily M. Linehan, Gilbert, AZ (US); Zia Hossain, Tempe, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/104,039

(22) Filed: Aug. 16, 2018

(65) Prior Publication Data
US 2019/0067266 A1    Feb. 28, 2019

Related U.S. Application Data

(60) Provisional application No. 62/548,904, filed on Aug. 22, 2017.

(51) Int. Cl.
| H01L 29/66 | (2006.01) |
| H01L 27/02 | (2006.01) |
| H01L 29/10 | (2006.01) |
| H01L 29/78 | (2006.01) |
| H01L 29/423 | (2006.01) |
| H01L 27/088 | (2006.01) |
| H01L 29/08 | (2006.01) |

(Continued)

(52) U.S. Cl.
CPC ........ H01L 27/0207 (2013.01); H01L 27/088 (2013.01); H01L 29/0696 (2013.01); H01L 29/0882 (2013.01); H01L 29/1033 (2013.01); H01L 29/1095 (2013.01); H01L 29/407 (2013.01); H01L 29/4236 (2013.01); H01L 29/42376 (2013.01); H01L 29/7813 (2013.01); H01L 29/7835 (2013.01); H01L 29/4238 (2013.01)

(58) Field of Classification Search
USPC ........................................ 257/334
See application file for complete search history.

(56) References Cited

U.S. PATENT DOCUMENTS

| 5,510,278 A | 4/1996 | Nguyen et al. |
| 5,998,837 A | 12/1999 | Williams |

(Continued)

FOREIGN PATENT DOCUMENTS

WO    2006136979 A2    12/2006

*Primary Examiner* — Niki H Nguyen
(74) *Attorney, Agent, or Firm* — Abel Schillinger, LLP

(57) ABSTRACT

An electronic device can include a transistor having a gate electrode, a first portion, and a second portion, wherein along the gate electrode, the first portion of the transistor has a first gate-to-drain capacitance and a first gate-to-source capacitance, the second portion of the transistor has a second gate-to-drain capacitance and a second gate-to-source capacitance, and a ratio of the first gate-to-drain capacitance to the first gate-to-source capacitance is less than a ratio of the second gate-to-drain capacitance to the second gate-to-source capacitance.

19 Claims, 9 Drawing Sheets

(51) Int. Cl.
  *H01L 29/06* (2006.01)
  *H01L 29/40* (2006.01)

(56) References Cited

U.S. PATENT DOCUMENTS

| | | | |
|---|---|---|---|
| 8,034,685 | B1 | 10/2011 | Ventkatraman et al. |
| 8,907,415 | B2 * | 12/2014 | Hsieh .................... H01L 29/407 |
| | | | 257/331 |
| 2003/0160270 | A1 | 8/2003 | Pfirsch et al. |
| 2005/0116282 | A1 * | 6/2005 | Pattanayak ......... H01L 29/7813 |
| | | | 257/327 |
| 2007/0290257 | A1 | 12/2007 | Kraft et al. |
| 2009/0212854 | A1 * | 8/2009 | Baumgartner ...... H01L 29/4238 |
| | | | 327/543 |
| 2010/0301410 | A1 * | 12/2010 | Hirler ................. H01L 29/7813 |
| | | | 257/334 |
| 2010/0330767 | A1 | 12/2010 | Lui et al. |
| 2015/0001532 | A1 | 1/2015 | Yamazaki et al. |

\* cited by examiner

ELECTRONIC DEVICE INCLUDING A TRANSISTOR HAVING STRUCTURES WITH DIFFERENT CHARACTERISTICS

CROSS REFERENCE TO RELATED APPLICATION

This application claims priority under 35 U.S.C. § 119(e) to U.S. Patent Application No. 62/548,904 entitled "Improving the Switching Characteristics of Power MOSFETs for Efficient Power Conversion in HPPC," by Padmanabhan et al., filed Aug. 22, 2017, which is assigned to the current assignee hereof and incorporated herein by reference in its entirety.

FIELD OF THE DISCLOSURE

The present disclosure relates to electronic devices, and more particularly to, electronic devices including a transistor having structures with different electrical or physical properties.

RELATED ART

Transistors may experience large swings in voltage during switching operations. Such behavior may occur in a circuit that includes a power transistor. An example of such a circuit can include a buck converter circuit that can include a low-side transistor and a high-side transistor, wherein the drain of the low-side transistor is electrically connected to the source of the high-side transistor at a node. When operating the buck converter, the low-side or high-side transistor may be on; however, both transistors are not to be on at the same time. During one of the operating states of the buck converter circuit, the low-side transistor can be turned off, and the high-side transistor can be turned on. The voltage on the node between the low-side and high-side transistor can overshoot. Capacitive coupling between this node and the gate of the low-side transistor can cause the gate voltage to exceed the threshold voltage of the low-side transistor causing the low-side transistor to temporarily turn on when the high-side transistor is on. Such a situation can significantly reduce efficiency of the circuit. Further improvement of transistors during switching operations is desired.

BRIEF DESCRIPTION OF THE DRAWINGS

Embodiments are illustrated by way of example and are not limited in the accompanying figures.

Figure 2:
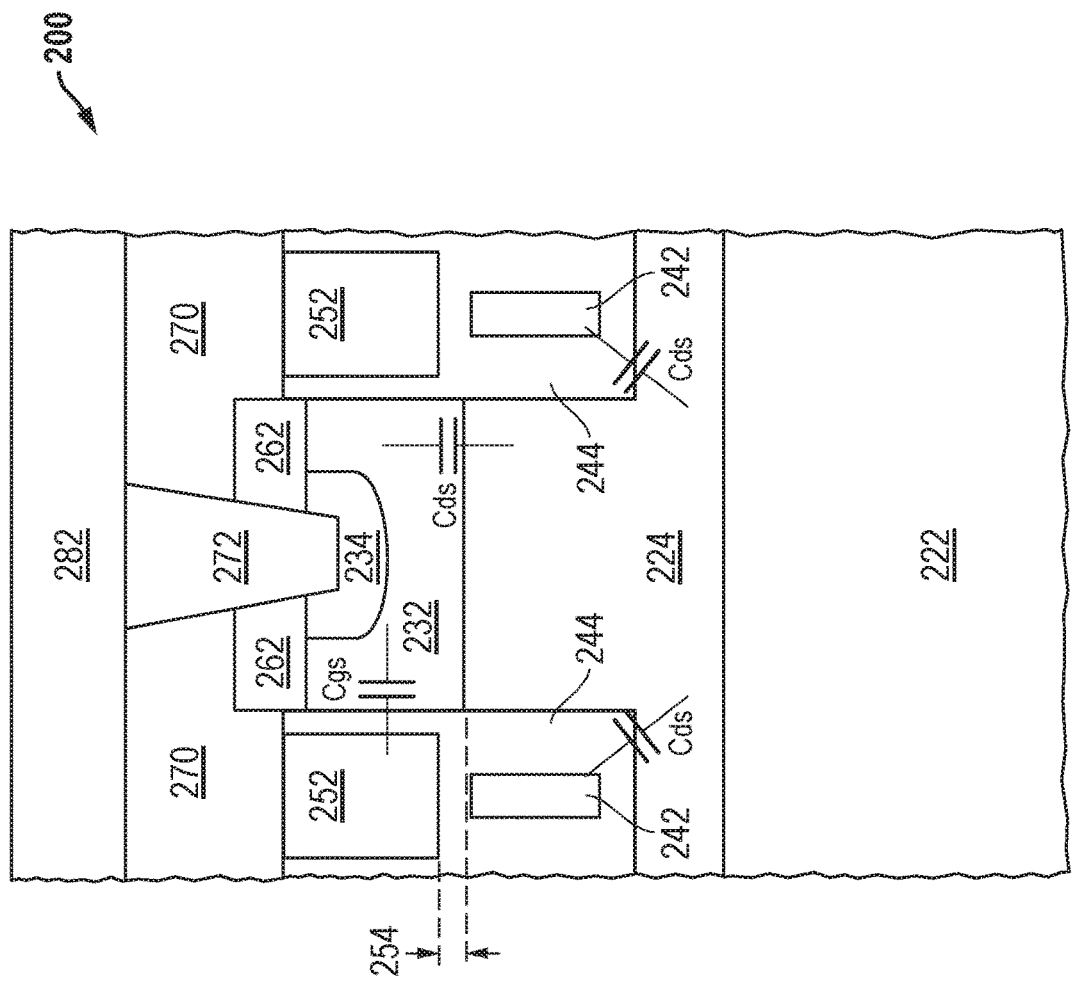
FIG. 2 includes an illustration of a cross-sectional view of a portion of a workpiece including a transistor structure having an offset drain region.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

For a transistor having a channel region, gate electrode, and drain region, the term "offset drain region" is intended to mean a portion of a channel region that extends beyond an edge of gate electrode toward the drain region. A transistor that has a gate electrode overlaps a drain region or the gate electrode has an edge coincident with the drain region does not have an offset drain region.

Lengths of a gate electrode and a channel region of a transistor are measured in a direction from a source region to a drain region of the transistor. Widths of a gate electrode and a channel region of a transistor are measured in the same direction that is perpendicular to the lengths. The amount of current flowing through the transistor is a function of the channel region width.

As used herein, "drain region" is intended to include a drift region or an extension region (also called a light-doped drain).

The term "metal" or any of its variants is intended to refer to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The term "normal operation" and "normal operating state" refer to conditions under which an electronic component or device is designed to operate. The conditions may be obtained from a data sheet or other information regarding voltages, currents, capacitance, resistance, or other electrical conditions. Thus, normal operation does not include operating an electrical component or device well beyond its design limits.

The term "power transistor" is intended to mean a transistor that is designed to normally operate in an on-state with current flowing between its drain and source or its collector and emitter of at least a 1A.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" (e.g., substantially the same) is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Group numbers corresponding to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Embodiments as described herein can be used to improve the performance of a transistor during switching operations. During switching operations, the change in voltage as a function of time (dV/dt) can be relatively high at a drain of a transistor. Embodiments described below can help to reduce problems that may arise due to a steep rise in voltage at a drain of a transistor. The transistor in accordance with embodiments described herein may be used in many different applications. Exemplary applications that can use the transistor can include an energy converter (such as a buck converter), an inverter, or another circuit where performance during and shortly after a switching operation is significant. In an embodiment, the concepts described herein can help to reduce the likelihood gate bounce within the transistor during voltage overshoot that can occur at the drain shortly after a switching operation has occurred. Along a width of a gate electrode of the transistor, a portion of the transistor can have a relatively lower Cgd/Cgs as compared to another portion of the same transistor. The different Cgd/Cgs ratios can be achieved by having different channel region lengths, different gate electrode lengths, or both different channel region lengths and different gate electrode lengths between the different portions of the transistor. In a non-limiting embodiment, an offset drain region can be used to reduce Cgd/Cgs ratio, where Cgd is the gate-to-drain capacitance, and Cgs is the gate-to-source capacitance. The offset drain region can be achieved by having a longer channel region length or by having a shorter gate electrode length. As will be described later, an offset drain region is not required in all embodiments.

The ratio of the areas occupied by the different portions of the transistor can be selected to help compensate for a higher voltage on the gate electrodes at locations farther along a conduction path from the gate pad. Thus, the transistor with different portions along the gate electrode can be used in a circuit with only changes in masks and without any further processing operations beyond those used in forming the transistor if it would not have the different regions.

In an aspect, an electronic device can include a transistor having a gate electrode, a first portion, and a second portion, wherein along the gate electrode, the first portion of the transistor has a first Cgd and a first Cgs, the second portion of the transistor has a second Cgd and a second Cgs, and a ratio of the first Cgd to the first Cgs is less than a ratio of the second Cgd to the second Cgs.

In another aspect, an electronic device can include a transistor including a first type of transistor structure and a second type of transistor structure, wherein the first type of transistor structure has an offset drain region, and the second type of transistor structure does not have an offset drain region.

In a further aspect, an electronic device can include a transistor that includes a first type of transistor structure having a first channel region length and a first gate electrode length; and a second type of transistor structure having a second channel region length and a second gate electrode length, wherein the first channel length is longer than the second channel length, or the first gate electrode length is shorter than the second gate electrode length, and the transistor does not include a shield electrode.

The transistor can have a gate that includes a single gate electrode or a plurality of gate electrodes. When the transistor includes a plurality of gate electrodes, at least one gate electrode can have the features as described herein, and one or more of the other gate electrodes may or may not have such features. This concept is better understood with respect to the layout seen in FIGS. 12 and 13 and described later in this specification.

The transistor with different types of transistor structures along the gate electrode can be used in many different applications. In order to provide a tangible example of a circuit in which the transistor is used, much of the description below addresses a circuit with low-side and high-side transistors. Clearly, the invention is not limited to this particular circuit. The transistor can be implemented in other circuits that have switching operations, where such other circuit may or may not include an additional transistor that may or may not have the features described herein.

Figure 1:
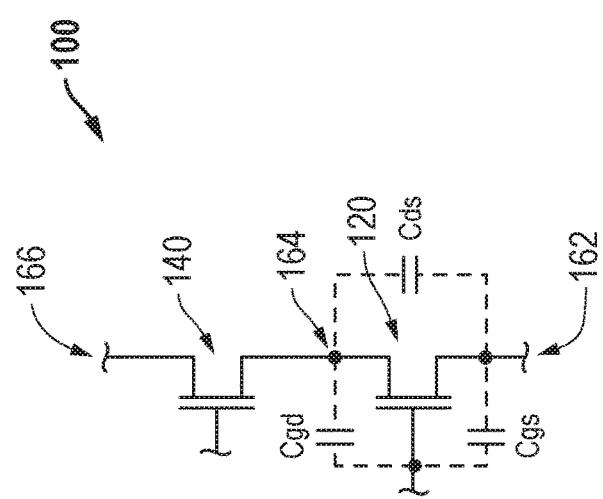
FIG. 1 includes a depiction of a circuit of an energy converter that includes a pair of switching transistors.

FIG. 1 includes a schematic diagram of a circuit 100 that includes a low-side transistor 120 and a high-side transistor 140. In an embodiment, the low-side and high-side transistors 120 and 140 are power transistors. A source of the low-side transistor 120 is coupled to a source terminal 162, a drain of the low-side transistor 120 is connected to a source of the high-side transistor 140 at a node 164, and a drain of the high-side transistor 140 is coupled to a drain terminal 166. Gates of the transistors 120 and 140 are coupled to control circuitry to turn on and off the transistors 120 and 140. The control circuitry is designed so that a signal to turn on a transistor in the circuit 100 is supplied to only one of the transistors 120 and 140 at a time. Both transistors 120 and 140 are not to be turned on at the same time. The circuit 100 is useful in a power converter, such a buck converter, voltage regulator, or the like.

Each of the transistors 120 and 140 has a drain-to source capacitance (Cds), a Cgd, and a Cgs. The inventors have discovered that by changing the ratio of the Cgd to the Cgs in a transistor, such as the low-side transistor 120, gate bounce can be significantly reduced. Without the discovery, when the low side transistor is turned off and the high side transistor turns on, the voltage at the drain of the low side transistor can overshoot. Capacitive coupling between the drain and the gate of the low-side transistor can cause the gate voltage, locally or globally, to exceed the threshold voltage for the low-side transistor and temporarily turn on at least a portion of the low-side transistor while the high-side transistor is on. The problem may be more severe as the distance along a conduction path from a gate pad or other gate terminal increases, due to parasitic resistance along a metal gate interconnect or along a gate electrode that includes a silicon-containing material (e.g. doped polysilicon, metal silicide, or both).

The lower Cgd/Cgs for the low-side transistor 120 allows for better resistance to gate bounce and a reduced likelihood of the low-side transistor 120 from turning on due to voltage overshoot at the node 164 shortly after the high-transistor 140 is turned on. As will be discussed in more detail below, the lower Cgd/Cgs can be achieved by increasing the channel region length, decreasing the gate electrode length, or both. In a particular embodiment, increasing the channel region length, decreasing the gate electrode length, or both may be performed to an extent that the low-side transistor 120 has an offset drain region. In another embodiment, the low-side transistor 120 does not have an offset drain region.

Figure 3:
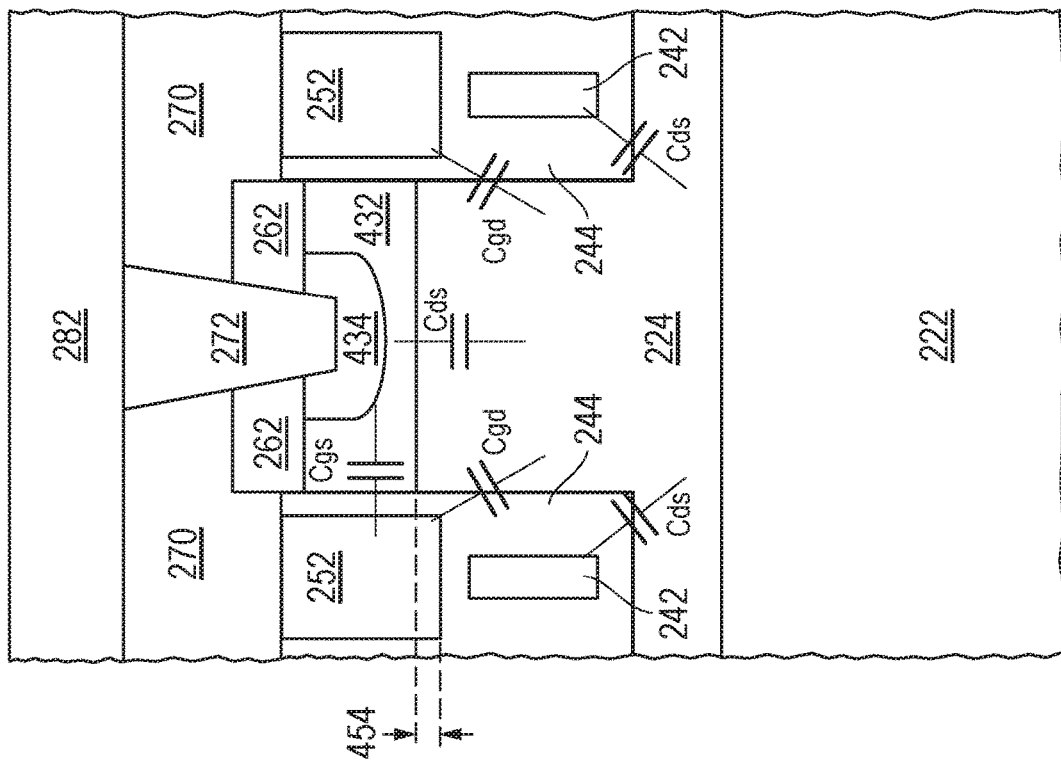
FIG. 3 includes an illustration of a cross-sectional view of a portion of a workpiece including a transistor structure without an offset drain region and a particular length of gate-to-drain overlap region.
Figure 4:
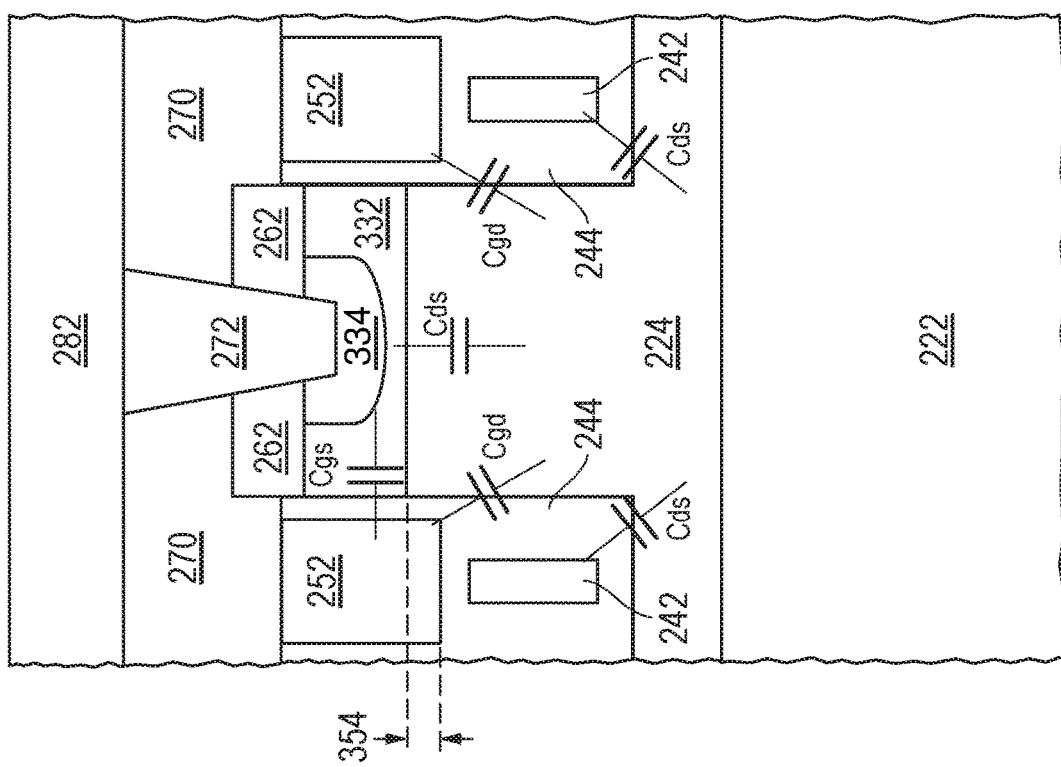
FIG. 4 includes an illustration of a cross-sectional view of a portion of a workpiece including a transistor structure without an offset drain region and length of gate-to-drain overlap region that is different from FIG. 3.
Figure 6:
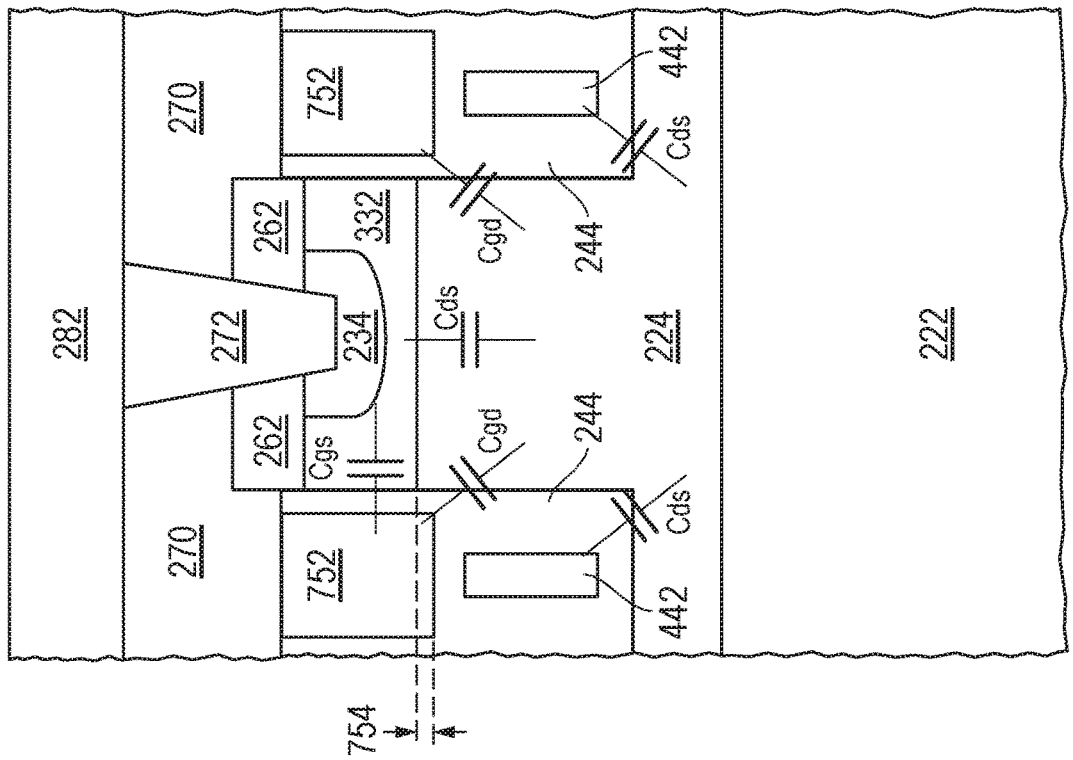
FIG. 6 includes an illustration of a cross-sectional view of a portion of a workpiece including a transistor structure having an offset drain region in accordance with another embodiment.
Figure 7:
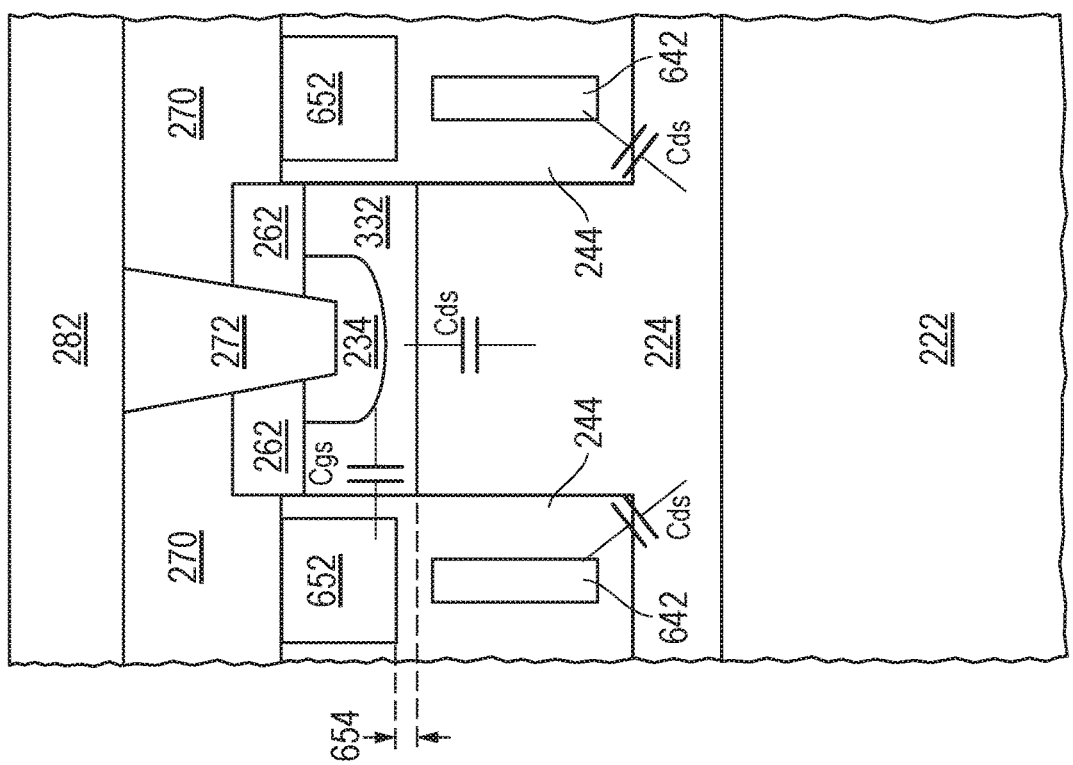
FIG. 7 includes an illustration of a cross-sectional view of a portion of a workpiece including a transistor structure without an offset drain region in accordance with another embodiment and length of gate-to-drain overlap region that is different from FIG. 3.

In an embodiment, the low-side transistor 120 can include portions with any combination of the types of transistor structures as illustrated in FIGS. 2, 3, and 4, and potentially other types of transistor structures. FIG. 2 includes a cross-sectional view of a portion of a workpiece 200 that includes a type of transistor structure having an offset drain region, and each of FIGS. 3 and 4 includes a cross-sectional view of another portion of the workpiece 200 that includes another type of transistor structure without an offset drain region with a particular length of gate-to-drain overlap region illustrated as dimension 354 (FIG. 3) or 454 (FIG. 4). The transistor structures in FIGS. 3 and 4 are similar except that the well regions 332 and 432 have different depths. As illustrated in FIGS. 2, 3 and 4, a workpiece 200 includes the transistor structures having different channel region lengths, where the transistor structures can be formed within different portions of the workpiece 200. Such structures may be associated with the same gate electrode or between different gate electrodes within the same transistor. In another embodiment as illustrated in FIGS. 3, 6, and 7, a workpiece includes the transistor structures having different gate electrode lengths, where the transistor structures can be formed within different regions of the workpiece 200. Such structures may be associated with the same gate electrode or between different gate electrodes within the same transistor. The embodiments that includes the transistor structures illustrated in FIGS. 2, 3, and 4 and common with the transistor structures in FIGS. 6 and 7 are described before particular aspects of the embodiments that include the transistor structures illustrated in FIGS. 3, 6, and 7.

In FIGS. 2 and 3, the transistor structures include a substrate 222 and a semiconductor layer 224. The combination of the substrate 222 and the semiconductor layer 224 forms the drain region for the transistor structure. In an embodiment, the drain region of the transistor structure is coupled to a source region of the high-side transistor, and in a particular embodiment, the drain region of the transistor structure is electrically connected to a source region of the high-side transistor. The semiconductor layer 224 can be a drift region of the drain region, and the substrate 222 can be a heavily doped portion of the drain region that can contact the drain terminal 166 (not illustrated in FIGS. 2, 3, 4, 6, and 7).

The substrate 222 can include a Group 14 element (i.e., carbon, silicon, germanium, or any combination thereof) and can be heavily n-type or p-type doped. For the purposes of this specification, heavily doped is intended to mean a peak dopant concentration of at least approximately $1 \times 10^{19}$ atoms/cm$^3$, and lightly doped is intended to mean a peak dopant concentration of less than approximately $1 \times 10^{19}$ atoms/cm$^3$. The substrate 222 can be a portion of a heavily doped wafer (e.g., a heavily n-type doped wafer). In an embodiment, the base semiconductor material of the substrate 222 is heavily doped with a n-type dopant, such as arsenic, phosphorus, antimony or the like.

The semiconductor layer 224 is disposed over the substrate 222. The semiconductor layer 224 can include a Group 14 element. In an embodiment, the semiconductor layer 224 has the same conductivity type as substrate 222. In a particular embodiment, the semiconductor layer 224 is a lightly doped n-type epitaxial silicon layer. The dopant can be arsenic, phosphorus, antimony or the like. As deposited, the dopant concentration of the semiconductor layer 224 near the subsequently-formed gate electrode 252 can be in a range of $1 \times 10^{13}$ atoms/cm$^3$ to $5 \times 10^{17}$ atoms/cm$^3$. The thickness of the semiconductor layer 224 may depend on the designed normal operating voltage of the transistor structures being formed. The thickness of the semiconductor layer 224 can be in a range of approximately 1 micron to approximately 50 microns. The semiconductor layer 224 may be disposed over all of the substrate 222.

Well regions 232 (FIG. 2), 332 (FIG. 3) and 432 (FIG. 4) can be formed from a portion of the semiconductor layer 224. The well regions 232, 332, and 432 have different depths as compared to each other. The well regions 232, 332, and 432 have the same conductivity type that is opposite the conductivity type of the semiconductor layer 224. The well regions 232, 332, and 432 can be lightly doped p-well regions. The dopant can be boron. In an embodiment, excluding well contact regions 234, 334, and 434, the well regions 232, 332, and 432 have an average dopant concentration in a range of $1\times10^{14}$ atoms/cm$^3$ to $5\times10^{18}$ atoms/cm$^3$. The well regions 232, 332, and 432 can have substantially the same average dopant concentration or may have different average dopant concentrations.

Each of well regions 232, 332, and 432 can be formed using a single or series of ion implantations to achieve the desired depths. The well regions 232 and 432 have depths that are deeper as compared to the well region 332. In an embodiment, each of the well regions 232, 332, and 432 can have at least one ion implantation in common. The well region 232 and 432 may receive one or more ion implantations when the well region 332 is masked. The depth of the well regions 232 and 332 depend on the gate electrode length of the transistor structures. Referring to FIG. 2, the depth of the well region 232 is deeper than the gate electrode length of the gate electrodes 252 to provide the offset drain region having a length illustrated by dimension 254. Referring to FIG. 3, the depth of the well region 332 is shallower than the gate electrode length of the gate electrodes 252 and has gate-to-drain overlap length illustrated by dimension 354. Referring to FIG. 4, the depth of the well region 432 is shallower than the gate electrode length of the gate electrodes 252 and has gate-to-drain overlap length illustrated by dimension 454. The dimension 354 is greater than the dimension 454, and unlike the transistor structure in FIG. 2, the transistor structures as illustrated in FIGS. 3 and 4 do not have an offset drain region. More details regarding the depths of the well regions 232, 332, and 432 will be addressed with the discussion of the gate electrodes 252.

The well regions 232, 332, and 432 and the semiconductor layer 224 are patterned to define trenches. The trenches include shield electrodes 242 and the gate electrodes 252. Insulating material 244 lies between the shield electrodes 242, gate electrodes 252, and sidewalls of the trenches. The insulating material 244 can include an oxide, a nitride, or an oxynitride. The shield electrodes 242 help to reduce Cgd. The insulating material 244 is relatively thicker between the shield electrodes 242 and the sidewalls of the trenches as compared to between the gate electrodes 252 and the sidewalls of the trenches. The gate electrodes 252 are part of the gate for the low-side transistor 120.

An exemplary, non-limiting process sequence is described with respect to the features illustrated in FIGS. 2, 3, and 4. A first portion of the insulating material 244 is grown or deposited within the trenches. The first portion may or may not be formed over the upper surface of the workpiece. The first portion of the insulating material 244 fills only a part, and not all, of the trenches. A conductive layer for the shield electrodes 242 fills a remaining portion of the trenches. The conductive layer can be deposited over the workpiece within and outside of the trenches. The conductive layer can include a heavily doped semiconductor layer. In another embodiment, the conductive layer can include a metal. In a more particular embodiment, the conductive layer can include an adhesion layer, a barrier layer, and a bulk conduction layer. The conductive layer, whether including a semiconductor or metal material, is etched to remove portions of the conductive layer lying outside the trenches and to recess the conductive layer within the trenches to form the shield electrodes 242. Exposed portions of the insulating material 244 can be isotropically etched to remove the insulating material 244 at elevations above the tops of the shield electrodes 242.

Another portion of the insulating material 244 is grown or deposited within the trenches and over the shield electrodes 242. Such other portion may or may not be formed over the upper surface of the workpiece. This portion of the insulating material 244 includes the gate dielectric layer for the transistors and fills only a part, and not all, of the remaining part of the trenches. A conductive layer for the gate electrodes 252 fills a remaining portion of the trenches. The conductive layer can be deposited over the workpiece outside of the trenches. The conductive layer can include a heavily doped semiconductor layer. In another embodiment, the conductive layer can include a metal. In a more particular embodiment, the conductive layer can include a film closer to the gate dielectric layer that has a desired work function and another film having a different composition that is used for bulk conduction. The conductive layer, whether including a semiconductor or metal material, is etched to remove portions of the conductive layer lying outside the trenches. This conductive layer can be recessed in the trenches to form the gate electrode 252. Exposed portions of the insulating material 244 can be etched to remove the insulating material 244 outside of the trenches.

The gate electrode length of the gate electrodes 252 corresponds to the distance from the top of the gate electrodes 252 to the bottom of the gate electrodes 252 that is adjacent to the shield electrodes 242. Thus, the gate electrode length is in the vertical direction as illustrated in FIGS. 2, 3, and 4, as the transistor structures are parts of vertical transistors. The gate electrode length is in a range of 20 nm to 1000 nm. Gate electrode widths and channel region widths extend into and out of FIGS. 2, 3, and 4.

An interlevel dielectric (ILD) layer 270 can be formed and include a single film or a plurality of films. The single film or each of the films can include an oxide, a nitride, or an oxynitride. The ILD layer 270 can have a thickness in a range from 20 nm to 800 nm. Contact openings for the source regions 262, well contact regions 234, 334, and 434, shield electrodes 242, and gate electrodes 252 can extend through the ILD layer 270. After forming the contact openings for the source regions 262 and well regions 232, 332, and 432, portions of the well regions 232, 332, and 432 along the bottom of the contact openings are heavily doped with a dopant having the same conductivity type as the well regions 232, 332, and 432 to form the well contact regions 234, 334, and 434 allowing ohmic contacts to be formed to the well regions 232, 332, and 432. The contact openings for the shield and gate electrodes 242 and 252 are at locations not illustrated in FIGS. 2, 3, 4, 6, and 7.

In an embodiment, a conductive plug 272 can be formed from a conductive layer having a plurality of films. In an embodiment, a layer including a refractory metal, such as Ti, Ta, W, Co, Pt, or the like, can be deposited over the workpiece and within the contact openings. The workpiece can be annealed so that portions of the film including the refractory metal are selectively reacted with exposed silicon at the bottom of the contact openings, such as substantially monocrystalline or polycrystalline silicon, to form a metal silicide. A metal nitride film may be formed to further fill a part, but not the remainder, of the openings. The metal nitride film can act as a barrier film. A conductive material fills the remainder of the contact openings, the conductive fill material can include W. Portions of the layer including the refractory metal, the metal nitride film and the conductive film material that lies outside the contact openings are removed to form the conductive plugs 272. Although not illustrated, contact plugs are made to the shield and gate electrodes and other source regions of the transistor at locations not illustrated in FIGS. 2, 3, 4, 6, and 7.

A conductive layer is formed over the ILD layer 270 and the conductive plugs, such as the conductive plug 272. The conductive layer can include one or more films. In an embodiment, the conductive layer can include an adhesion film and a barrier film. Such films may include Ta, TaSi, Ti, TiW, TiSi, TiN, or the like. The conductive layer can further include a conductive bulk film. The bulk film can include Al, Cu, or another material that is more conductive than other films within the conductive layer. In an embodiment, the bulk film can include at least 90 wt. % Al or Cu. The bulk film can have a thickness that is at least as thick as the other films within the conductive layer. In an embodiment, the bulk film has a thickness in a range from 20 nm to 5000 nm. More or fewer films can be used in the conductive layer. The conductive layer is patterned to form a source interconnect 282. Although not illustrated, other interconnects are formed over other conductive plugs that contact the shield and gate electrodes and other source regions of the transistor at locations not illustrated in FIGS. 2, 3, 4, 6, and 7.

Processing is continued to form a substantially completed device. One or more other interconnect levels and a passivation layer may be formed over the workpiece. Each interconnect level can include an interlevel dielectric layer and interconnects. The passivation layer can be formed over the uppermost interconnect level and patterned to expose bond pads. After a backgrind operation to remove a portion of the substrate, backside metal (not illustrated) is formed along the bottom surface of the substrate 222 to provide a drain connection that can serve as the drain terminal 166. In a finished device, the source regions 262 can be electrically connected to the shield electrodes 242 at locations outside the portions of the workpiece illustrated in FIGS. 2, 3, 4, 6, and 7.

In FIGS. 2 and 3, the channel region lengths are the distances of the well regions 232, 332, and 432 from the source regions 262 to the semiconductor layer 224 as measured in a vertical direction. In the embodiment of FIG. 2, the channel region length is at least 1 nm, at least 5 nm, or at least 11 nm longer than the gate electrode length of the gate electrodes 252, and in another embodiment, the channel region length is at most 500 nm, at most 50 nm, or at most 25 nm longer than the gate electrode length of the gate electrodes 252. In the embodiments of FIGS. 3 and 4, the channel region length is at least 1 nm, at least 5 nm, or at least 11 nm shorter than the gate electrode length of the gate electrodes 252, and in another embodiment, the channel region length is at most 500 nm, at most 50 nm, or at most 25 nm shorter than the gate electrode length of the gate electrodes 252. Referring to FIGS. 3 and 4, the channel region length of the transistor structure in FIG. 3 is at least 1 nm, at least 5 nm, or at least 11 nm longer than the channel region length of the transistor structure in FIG. 4. Thus, a variety of different channel region lengths may be used in different transistor structures.

Figure 5:
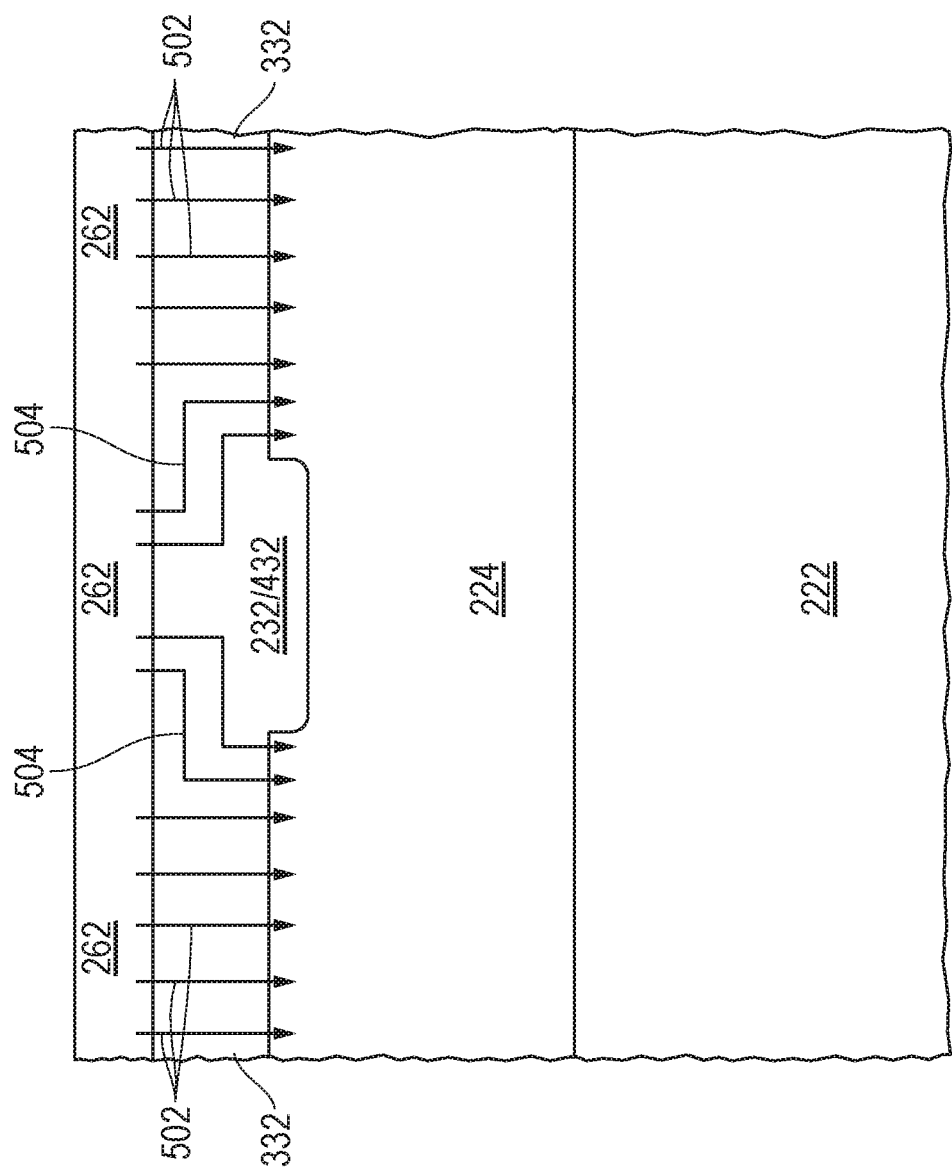
FIG. 5 includes an illustration of electrons flowing through a transistor that includes the transistor structures in FIG. 2 and FIG. 3/FIG. 4.

FIG. 5 includes an illustration that is rotated 90° with respect to the cross-sectional views in FIGS. 2, 3, and 4 adjacent to the sidewall of the trench. Thus, FIG. 5 is along a plane parallel to the channel region width and gate electrode width and perpendicular to the channel region length and gate electrode length. The well regions 232 and 432 extend further into the semiconductor layer 224 as compared to the well region 332. Arrows 502 and 504 illustrate how electrons flow through the well regions 232 and 332 or well regions 432 and 332. For the well region 332, most of the electrons flow in a vertical direction. The relatively deeper well region 232/432 can provide more resistance to electrons flowing, and thus, at least some of the electrons laterally move from the well region 232/432 to the well region 332 before entering the semiconductor layer 224.

In the embodiment illustrated in FIGS. 2, 3, and 4, the gate electrode lengths of the gate electrodes 252 are substantially the same, and different gate-to-drain capacitances are achieved by having different channel region lengths. In another embodiment, the channel region lengths can be substantially the same, and different gate electrode lengths may be used, as will be described below with respect to FIGS. 3, 6, and 7.

In another embodiment, FIG. 6 includes an illustration in which a transistor can include a type of transistor structure in which gate electrode lengths of gate electrodes 652 are less than the channel region lengths of the channel regions that are the same as the depth of the p-well region 332. The transistor also includes another type of transistor structure that is illustrated in FIG. 3. The process to form shield electrodes 642 in FIG. 6 and shield electrodes 742 in FIG. 7, the gate electrodes 652 in FIG. 6 and gate electrodes 752 in FIG. 7, and insulating layer 244 is substantially the same as forming the shield electrodes 242, gate electrodes 252, and the insulating material 244 as previously described. As compared to the shields electrodes 242, the shield electrodes 642 and 742 are not recessed as far within the trenches. In an embodiment, a smaller amount of conductive material for the gate electrodes 652 and 752 is formed within the trenches as compared to the gate electrodes 242. The gate-to-drain overlap length illustrated by dimension 754 in FIG. 7 is different from the gate-to-drain overlap length illustrated by dimension 354 in FIG. 3. In an embodiment, the dimension 754 is less than the dimension 354. As seen with the dimension 654, the gate electrodes 652 do not overlap the drain region, and thus, has an offset drain region.

In an embodiment, the shield electrodes 242, gate electrodes 252, and insulating material 244 for the transistor structure as illustrated in FIG. 3 can be formed during a separate processing sequence as compared to the shield electrodes 642, gate electrodes 652, and insulating material 244 for the transistor structure as illustrated in FIG. 6, or the shield electrodes 742, gate electrodes 752, and insulating material 244 for the transistor structure as illustrated in FIG. 7. In another embodiment, the trenches and the features therein can be formed during the same process sequence. The process would be the same for both transistor structures up until the shield electrodes 642 or the shield electrodes 742 are formed. After forming the shield structures in trenches for both transistor structures similar to the shield electrodes 642 or the shield electrodes 742, a mask can be formed over the transistor structure in FIG. 6 or 7 while the transistor structure in FIG. 3 remains exposed. An etch or other removal technique can be used to further recess the conductive layer within the trench for the transistor structure in FIG. 3 until the shield electrodes 242 are formed. The mask is removed, and the remainder of processing is the same for both transistor structures.

Combinations of different types of transistors structures (e.g., FIGS. 3 and 2, FIGS. 3 and 4, FIGS. 3 and 6 or FIGS. 3 and 7) can be integrated into the same transistor. Within the layout, portions of a gate electrode within the transistor can be at a distance farther along a conduction path from a gate pad and be more susceptible to gate bounce. Thus, a ratio of an area occupied by a particular type of transistor structures with relatively longer channel lengths or relatively shorter gate electrode lengths (e.g., FIG. 2 or 6) to an area occupied by a different type of transistor structures with relatively shorter channel lengths or relatively longer gate electrode lengths (e.g., FIG. 3 or 7) may be greater as a distance along the conduction path from the gate pad increases.

Figure 8:
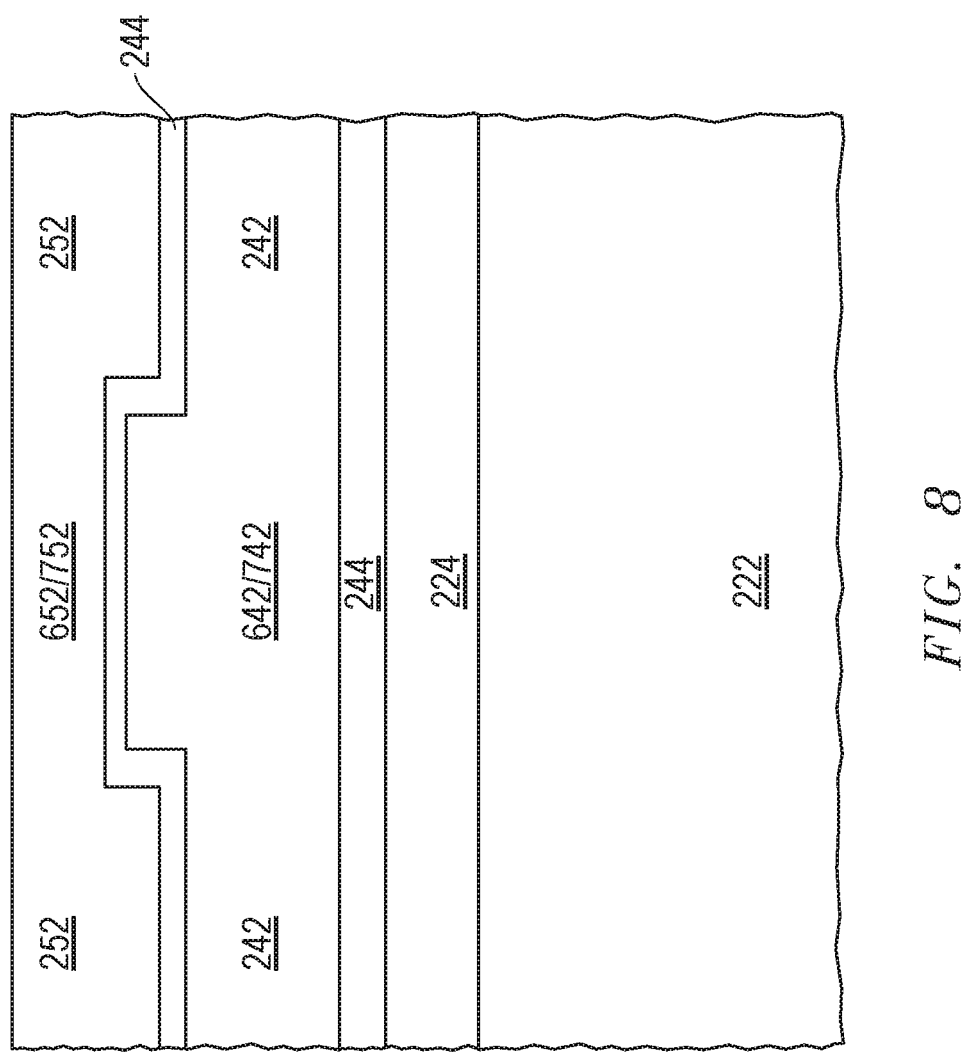
FIG. 8 includes an illustration of a cross-sectional view of portions of the gate and shield electrode in a direction perpendicular to the illustrations in FIG. 2 and FIG. 6/FIG. 7.

FIG. 8 includes an illustration that is rotated 90° with respect to the cross-sectional views in FIG. 3 and (6 or 7) through the center of the trench. Thus, FIG. 8 is along a plane parallel to the channel region width and gate electrode width and perpendicular to the illustrations in FIGS. 3, 6, and 7. The shield electrode includes portions 242 and 642 or 742, corresponding to the shield electrode as illustrated in FIG. 3 and (6 or 7), respectively. The gate electrode includes portions 252 and 652 or 752, corresponding to the gate electrode as illustrated in FIG. 3 and (6 or 7), respectively. The portions 252, 652, and 752 having drain-to-gate overlaps corresponding to dimensions 354, 654, and 754 that are different from one another.

Figure 10:
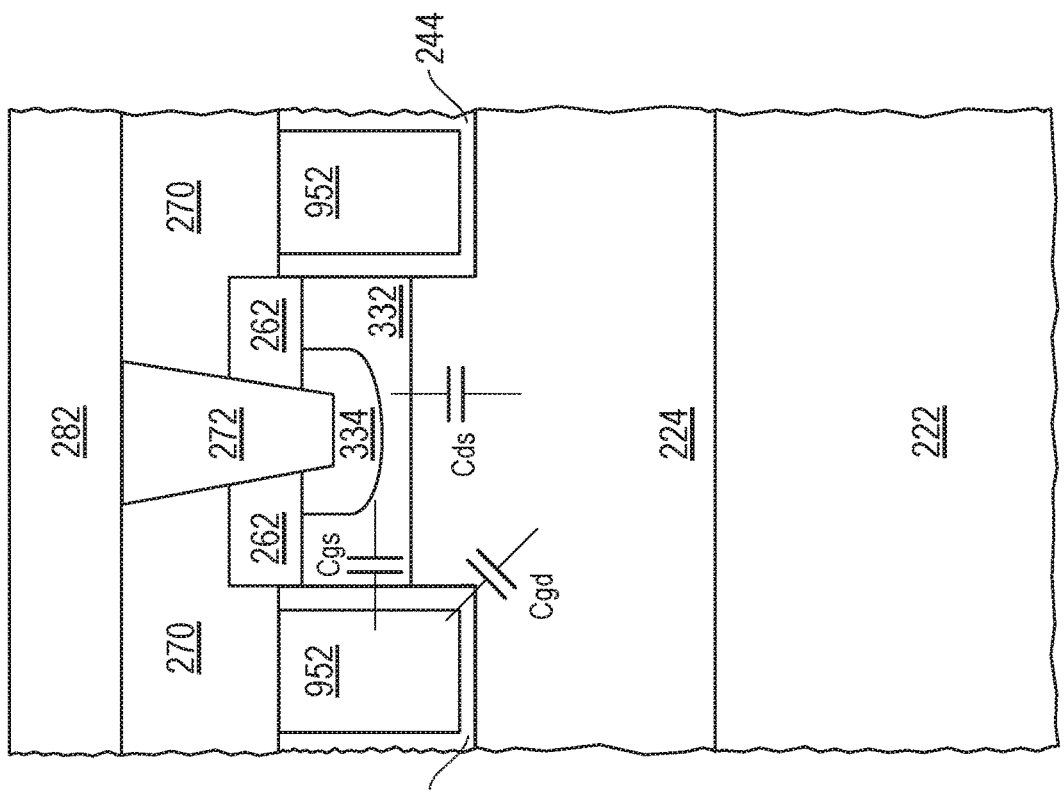
FIG. 10 includes an illustration of a cross-sectional view of a portion of a workpiece including a transistor structure in accordance with another embodiment structure without an offset drain region and a particular length of gate-to-drain overlap region.
Figure 9:
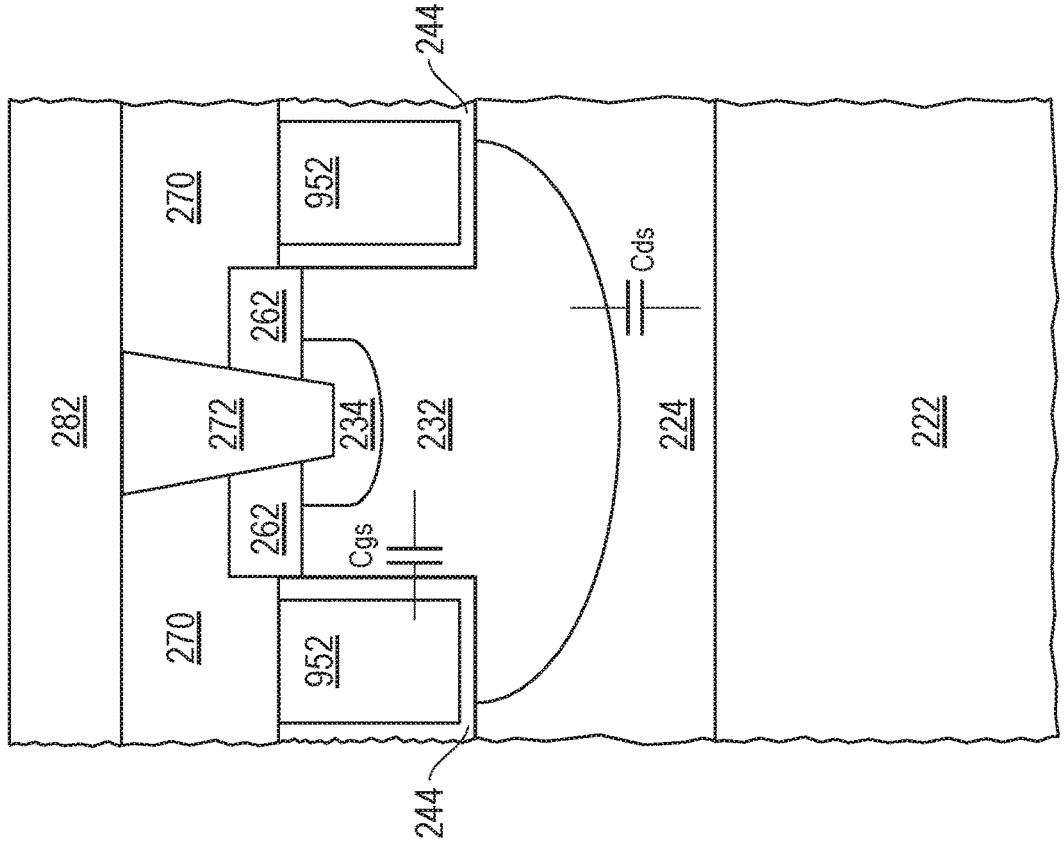
FIG. 9 includes an illustration of a cross-sectional view of a portion of a workpiece including a transistor structure in accordance with another embodiment having an offset drain region.
Figure 11:
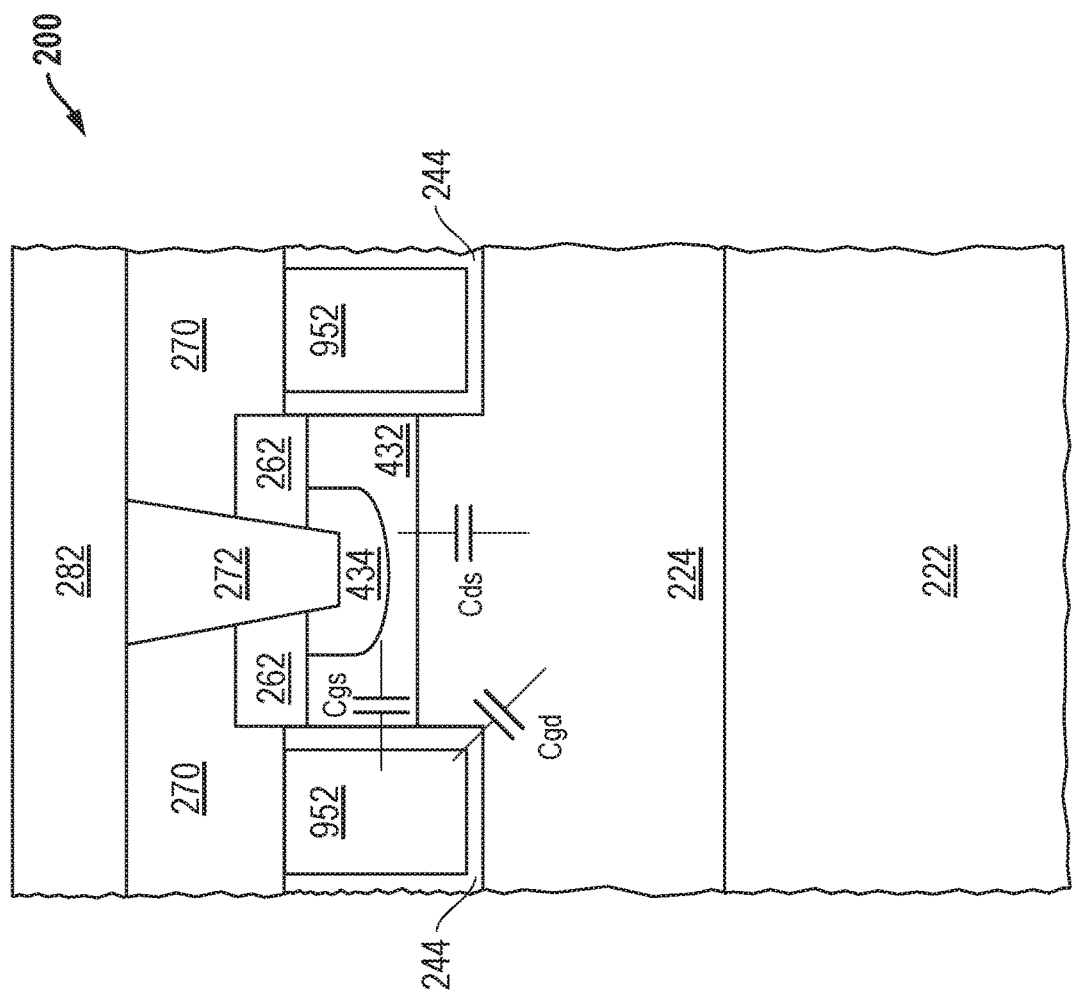
FIG. 11 includes an illustration of a cross-sectional view of a portion of a workpiece including a transistor structure in accordance with another embodiment structure without an offset drain region and a length of gate-to-drain overlap region that is different from FIG. 10.

FIGS. 9 to 11 include illustrations of transistor structures similar to FIGS. 2 to 4, respectively, except that shield electrodes are not present. In FIG. 9, the well region 232 can diffuse under the gate electrodes 952. Thus, the concepts are applicable to single polysilicon deposition processes and may be useful in field-effect transistors, such as metal-insulator-semiconductor field-effect transistors, insulated gate bipolar transistors, or the like.

Figure 12:
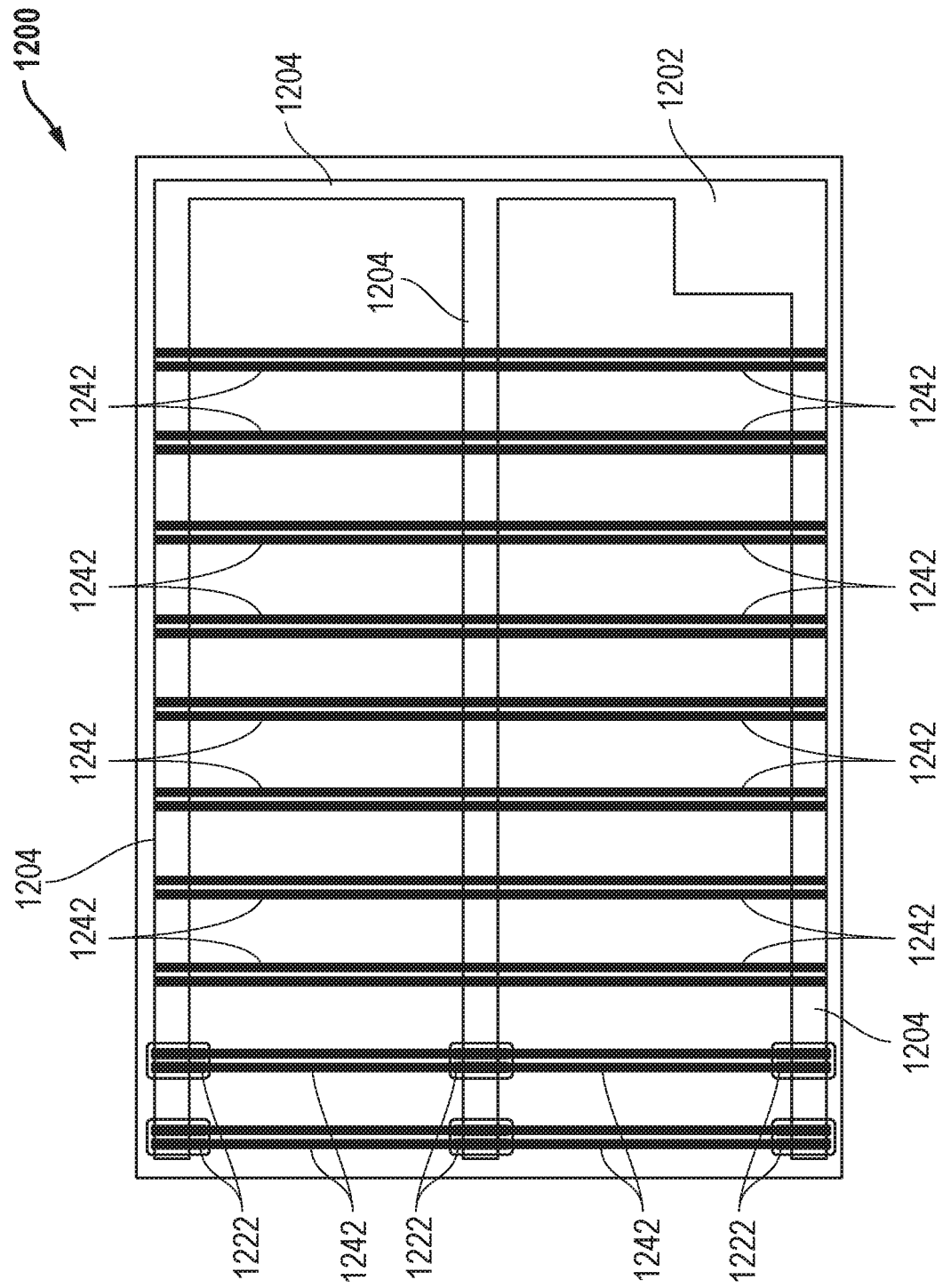
FIG. 12 includes an illustration of a top view of a gate pad and transistor structures in accordance with an embodiment.
Figure 13:
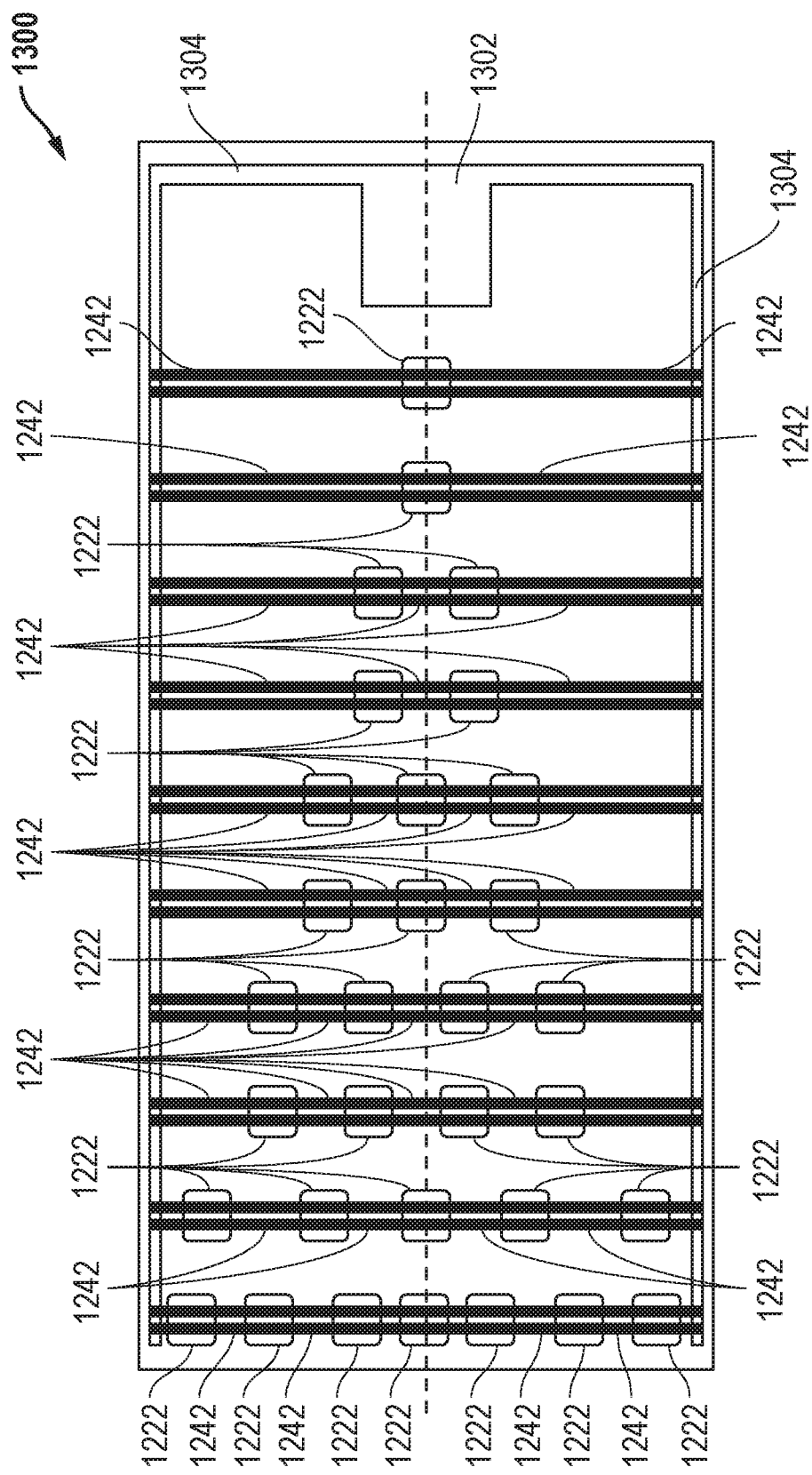
FIG. 13 includes an illustration of a top view of a gate pad and transistor structures in accordance with another embodiment.

FIGS. 12 and 13 include top views of embodiments in which combinations of different types of transistor structures can be used within a transistor. Before addressing particular details of the transistors and their components, some details are addressed to improve understanding of the selection and placement of transistor structures. Each pair of closely spaced vertical lines corresponds to a trench that each include a gate electrode (e.g., gate electrodes 252, 652, 752, 952), and, if applicable, a shield electrode 242. Each vertical line can correspond to a sidewall of a trench. Source region may be located between the pairs of closely spaced vertical lines. The channel region widths and gate electrode widths extend in directions parallel to the lengths of the trenches (top-to-bottom in FIGS. 12 and 13), and the channel region lengths and gate electrode lengths extend into the figures and are not seen in FIGS. 12 and 13.

FIGS. 12 and 13 include gate pads 1202 and 1302 and metal gate interconnects 1204 and 1304 that contact gate electrodes within the trenches. When the transistor is off, the gate pads 1202 and 1302 are at substantially the same voltage as the source regions. Ideally, all points along the gate interconnects and their corresponding gate electrodes are also at the voltage of the source regions. In practice, the metal gate interconnects 1204 and 1304 and gate electrodes have parasitic resistance associated with them. Hence, during or shortly after a switching transition (e.g., for a few nanoseconds to a microsecond) where the drain of the transistor increases from low to high voltage, as the distance along the conduction path from the gate pad increases, the voltage on a gate electrode at a particular location may be higher than the voltage at its corresponding gate pad or at another location along the conduction path closer to its corresponding gate pad. Without using the concepts described herein, at a particular point along the gate electrode, the voltage of the gate electrode at such particular point may be higher than the threshold voltage of the transistor due to gate-to-drain capacitance and parasitic resistance along the conduction path from the gate pad. Thus, the transistor may have unacceptably high drain-to-source current (Ids), even though the corresponding gate pad is maintained at the voltage of the source region. Once the transistor reaches steady state (e.g., at least a few microseconds after a switching operation), the voltage on along all of the gate electrodes within the transistor will be at substantially the same.

Combinations of the previously described types of transistor structures can be used to compensate for parasitic resistance along the gate electrodes and gate interconnects. The transistor can be designed with combinations of different types of transistor structures at particular areal densities based at least in part on distances along the conduction path from the gate pad. The combinations of the different types of transistor structures and corresponding areal densities can be used to achieve desired ratios of Cgd/Cgs. Such a design can allow the transistor to have lower leakage current shortly after a switching operation has occurred. Although FIGS. 12 and 13 illustrate two types of transistor structures, more than two types of transistor structures may be in the same transistor if needed or desired for a particular application.

FIG. 12 includes of a top view of an embodiment in which a transistor 1200 includes a combination of transistor structures 1222 and 1242. The combinations can include combinations of the transistor structures illustrated in FIGS. 2, 3, 4, 6, and 7. The transistor structures 1222 have a relatively longer channel region length, a relatively shorter gate electrode length, or both as compared to the transistor structures 1242. In one embodiment, the transistor structure 1222 can correspond to the transistor structure in FIG. 2, and the transistor structure 1242 can correspond to the transistor structure in FIG. 3 or 4, and in another embodiment, the transistor structure 1222 can correspond to the transistor structure in FIG. 3, and the transistor structure 1242 can correspond to the transistor structure in FIG. 4. Similar relationships between the transistor structures in FIGS. 6 (as an alternative to FIG. 2), 3, and 7 (as an alternative to FIG. 4) may alternative be used. If the transistor 1200 does not include shield electrodes, combinations of transistor structures in FIGS. 9 to 11 may be used.

Referring to FIG. 12, the transistor structures 1222 can help to counter the effect of the locally higher voltage on the gate interconnects 1204, as the transistor structures 1222 have a lower Cgd/Cgs as compared to the transistor structures 1242. Along the conduction path for the gate interconnects 1204 at points closer to the gate pad 1202, the voltage is closer to the voltage of the gate pad 1202. Thus, gate bounce may be less problematic for transistor structures in a section of the transistor closer to the gate pad 1202. In FIG. 12 the regions 1222 can be placed in the regions of the layout such as under the gate interconnects 1204. Some of the trenches in a second of the transistor closer to the gate pad 1204 have the transistor structures 1242 and do not include the transistor structures 1222. Within such trenches, the gate electrodes having substantially the same gate electrode length along each of the gate electrodes, and the well regions have substantially the same depth, and thus the channel region length is substantially the same along the entire gate electrode length.

FIG. 13 includes a top view of another embodiment in which a transistor 1300 includes the transistor structures 1222 and 1242. The dashed line in FIG. 13 bisects the layout to improve understanding of size and locations of features within the transistor 1300. FIG. 13 further leverages the ratio of transistor structures 1222 and 1242 with respect to distance along the conduction path from gate pad 1302. The gate interconnects 1304 are connected to the gate electrodes within the trenches. For a section of the transistor 1300 along the conduction path farther from the gate pad 1302, the ratio of area occupied by the transistor structures 1222 to the area occupied by the transistor structures 1242 is greater as compared to the ratio of area occupied by the transistor structures 1222 to the area occupied by the transistor structures 1242 in a section of the transistor 1300 along the conduction path closer to the gate pad 1302.

The areal density occupied by the transistor structures 1222 to the areal density occupied by the transistor structures 1242 can increase as the distance from the gate pad 1302 along the conduction path increases. In FIG. 13, within the same trench, the different ratios of areal densities can be achieved by changing the area occupied by the transistor structure 1242 between the transistor structures 1222. In particular, the channel region widths and gate electrode widths for the transistor structure 1242 can vary, as can be seen in the two left most trenches (depicted by pairs of closely spaced lines), and the channel region widths and gate electrode widths for the transistor structures 1222 are substantially the same. In another embodiment (not illustrated), within the same trench, the different ratios of areal densities can be achieved by changing the area occupied by the transistor structure 1222 between the transistor structures 1242. In particular, the channel region widths and gate electrode widths for the transistor structure 1222 can vary, as can be seen in the two left most trenches (depicted by pairs of closely spaced lines), and the channel region widths and gate electrode widths for the transistor structures 1242 are substantially the same. In a further embodiment, the areas of both the structures 1222 and 1242 can vary within the same trench or between different trenches to achieve desired Cgd values and corresponding Cgd/Cgs ratios.

Much of the description above addresses the low-side transistor 120. The concepts described above may or may not be applied to the high-side transistor 140. Thus, the high-side transistor 140 may or may not have different types of transistor structures as previously described with respect to the low-side transistor 120. For example, the high-side transistor 140 may not experience gate bounce or, if gate bounce occurs, the voltage or duration corresponding to gate bounce may be significantly less as compared to the low-side transistor 120. In an embodiment, the high-side transistor 140 may include transistor structures without an offset drain region. In another embodiment, the high-side transistor 140 may have different types of transistor structures along a gate electrode width where the difference in channel region lengths, gate electrode lengths, or both may be smaller than corresponding differences for the different types of transistor structures in the low-side transistor 120. In a further embodiment, the ratio of the different types of transistor structures within the high-side transistor 140 may be different as compared to the low-side transistor 120. In a particular embodiment, the high-side transistor 140 may have one or all channel regions with substantially uniform channel region lengths, one or all gate electrodes with substantially uniform gate electrode lengths, or both. After reading this specification, skilled artisans will be able to design the high-side transistor 140 for a particular application.

In another embodiment, the characteristics and properties of the transistor with different transistor structures can be implemented into another transistor in another application. Thus, the concepts are not limited to use in a low-side, high-side configuration as illustrated in FIG. 1. For example, a drain of a transistor may be coupled to another electrical component. The other electrical component may be a passive component, such as a resistor, capacitor, or inductor. In a further embodiment, the transistor may be coupled to another circuit. Thus, the transistor can be used in applications other than a buck converter.

Embodiments as described herein can be used to reduce the likelihood gate bounce within a transistor during voltage overshoot that can occur at a drain of the transistor shortly after a switching operation. During a transient period after the switching operation, voltage of the drain of the transistor may change very quickly (high dV/dt) after a switching operation. The transistor can have one or more transistor structures that have a relatively lower Cgd/Cgs as compared to another transistor structure within the same transistor. In an embodiment, the relatively lower Cgd/Cgs can be achieved by having a longer channel region length, a shorter gate electrode length, or both. The ratio of the areas occupied by different types of transistor structures can be selected to help compensate for a higher voltage on the gate electrodes at locations along a conduction path farther from the gate pad.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1

An electronic device can include a first transistor having a first gate electrode, a first portion, and a second portion, wherein along the first gate electrode, the first portion of the first transistor has a first gate-to-drain capacitance and a first gate-to-source capacitance, along the first gate electrode, the second portion of the first transistor has a second gate-to-drain capacitance and a second gate-to-source capacitance, and a ratio of the first gate-to-drain capacitance to the first gate-to-source capacitance is less than a ratio of the second gate-to-drain capacitance to the second gate-to-source capacitance.

Embodiment 2

The electronic device of Embodiment 1, wherein the first portion of the first transistor has a first channel region length, the second portion of the first transistor has a second channel region length, and the first channel region length is longer as compared to the second channel region length.

Embodiment 3

The electronic device of Embodiment 1, wherein the first gate electrode has a first gate electrode length within the first portion, the first gate electrode has a second gate electrode length within the second portion, and the first gate electrode length is shorter as compared to the second gate electrode length.

Embodiment 4

The electronic device of Embodiment 1, wherein the first portion of the first transistor has an offset drain region, and the second portion of the first transistor does not have an offset drain region.

Embodiment 5

The electronic device of Embodiment 1, wherein the first transistor includes a first type of transistor structure, a second type of transistor structure, and a gate pad, wherein:
the first type of transistor structure has a longer channel region length or a shorter gate electrode length as compared to the second type of transistor structure, the first transistor has a first section along a conduction path farther from the gate pad and a second section along the conduction path closer to the gate pad, and a ratio of an area occupied by the first type of transistor structure to an area occupied by the second type of transistor structure within the first section is greater than a ratio of an area occupied by the first type of transistor structure to an area occupied by the second type of transistor structure within the second section.

Embodiment 6

The electronic device of Embodiment 1, wherein the first transistor is a power transistor.

Embodiment 7

The electronic device of Embodiment 1, wherein the first transistor is a vertical transistor.

Embodiment 8

The electronic device of Embodiment 1 further includes a high-side transistor, wherein:
  the first transistor is a low-side transistor having a first type of transistor structure, a second type of transistor structure; and
  a source of the high-side transistor is coupled to a drain of the low-side transistor, within the low-side transistor, the first type of transistor structure has a longer channel region length or a shorter gate electrode length as compared to the second type of transistor structure,
  the high-side transistor has a substantially uniform channel region length and a substantially uniform gate electrode length,
  the low-side transistor has a first gate-to-drain capacitance, and
  the high-side transistor has a second gate-to-drain capacitance that is greater than the first gate-to-drain capacitance.

Embodiment 9

The electronic device of Embodiment 8, wherein the first channel region has a longer channel region length in the first type of transistor structure as compared to the second type of transistor structure, or the first gate electrode has a shorter gate electrode length in the first type of transistor structure as compared to the second type of transistor structure.

Embodiment 10

An electronic device can include a transistor including a first type of transistor structure and a second type of transistor structure, wherein the first type of transistor structure has an offset drain region, and the second type of transistor structure does not have an offset drain region.

Embodiment 11

The electronic device of Embodiment 10, wherein the transistor includes a channel region and a gate electrode, wherein a channel region length of the channel region is longer within the first type of transistor structure as compared to the second type of transistor structure, and the gate electrode has substantially a same gate electrode length within the first and second types of transistor structures.

Embodiment 12

The electronic device of Embodiment 10, wherein the transistor includes a channel region and a gate electrode, wherein a gate electrode length of the gate electrode is shorter within the first type of transistor structure as compared to the second type of transistor structure, and the channel region has substantially a same channel region length within the first and second types of transistor structures.

Embodiment 13

The electronic device of Embodiment 10, wherein the transistor further includes a gate pad, wherein along a conduction path, the gate pad is closer to the second type of transistor structure than to the first type of transistor structure.

Embodiment 14

The electronic device of Embodiment 10, wherein the transistor includes a gate pad, a first portion, and a second portion, wherein:
  along a conduction path, the gate pad is closer to the second portion than to the first portion;
  the first portion has a first ratio of a first area occupied by the first type of transistor structure to a second area occupied by the second type of transistor structure;
  the second portion has a second ratio of a third area occupied by the first type of transistor structure to a fourth area occupied by the second type of transistor structure; and
  the first ratio is greater than the second ratio.

Embodiment 15

The electronic device of Embodiment 10, wherein the transistor is a power transistor.

Embodiment 16

An electronic device including a transistor can include a first type of transistor structure having a first channel region length and a first gate electrode length; and a second type of transistor structure having a second channel region length and a second gate electrode length, wherein the first channel length is longer than the second channel length, or the first gate electrode length is shorter than the second gate electrode length, and the transistor does not include a shield electrode.

Embodiment 17

The electronic device of Embodiment 16, wherein the transistor further includes a gate pad, wherein the transistor has a first section along a conduction path farther from the gate pad and a second section along the conduction path closer to the gate pad, and a ratio of an area of the first type of transistor structure to an area of the second type of transistor structure within the first section is greater than a ratio of an area of the first type of transistor structure to an area of the second type of transistor structure within the second section.

Embodiment 18

The electronic device of Embodiment 16, wherein the first channel region length is longer than the second channel region length.

Embodiment 19

The electronic device of Embodiment 16, wherein the first gate electrode length is shorter than the second gate electrode length.

Embodiment 20

The electronic device of Embodiment 16, wherein the transistor includes a first gate electrode and a second gate electrode, wherein the first gate electrode is within the first and second types of transistor structures, and the second gate electrode is within one of the first and second types of transistor structures and does not include the other of the first and second types of transistor structures.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
    a first transistor having a first gate electrode, a first portion, and a second portion, wherein:
        along the first gate electrode, the first portion of the first transistor has a first gate-to-drain capacitance and a first gate-to-source capacitance,
        along the first gate electrode, the second portion of the first transistor has a second gate-to-drain capacitance and a second gate-to-source capacitance,
        a ratio of the first gate-to-drain capacitance to the first gate-to-source capacitance is less than a ratio of the second gate-to-drain capacitance to the second gate-to-source capacitance, and
    the first transistor comprises a first type of transistor structure, a second type of transistor structure, and a gate pad, wherein:
        the first type of transistor structure has a longer channel region length or a shorter gate electrode length as compared to the second type of transistor structure,
        the first transistor has a first section along a conduction path farther from the gate pad and a second section along the conduction path closer to the gate pad, and
        a ratio of an area occupied by the first type of transistor structure to an area occupied by the second type of transistor structure within the first section is greater than a ratio of an area occupied by the first type of transistor structure to an area occupied by the second type of transistor structure within the second section.

2. The electronic device of claim 1, wherein the first type of transistor structure has a shorter gate electrode length as compared to the second type of transistor structure.

3. The electronic device of claim 2, wherein the first type of transistor structure has a longer channel region length as compared to the second type of transistor structure.

4. The electronic device of claim 1, wherein the first portion of the first transistor has an offset drain region, and the second portion of the first transistor does not have an offset drain region.

5. The electronic device of claim 1, wherein the first transistor is a power transistor.

6. The electronic device of claim 1, wherein the first transistor is a vertical transistor.

7. The electronic device of claim 1, further comprising a high-side transistor, wherein:
    the first transistor is a low-side transistor,
    a source of the high-side transistor is coupled to a drain of the low-side transistor,
    the high-side transistor has a substantially uniform channel region length and a substantially uniform gate electrode length,
    the low-side transistor has a first gate-to-drain capacitance, and
    the high-side transistor has a second gate-to-drain capacitance that is greater than the first gate-to-drain capacitance.

8. The electronic device of claim 7, wherein:
    the first gate electrode has a shorter gate electrode length in the first type of transistor structure as compared to the second type of transistor structure.

9. An electronic device comprising:
    a transistor including:
        a first type of transistor structure;
        a second type of transistor structure; and
        a gate pad, wherein:
            the first type of transistor structure has an offset drain region,
            the second type of transistor structure does not have an offset drain region, and
            along a conduction path, the gate pad is closer to the second type of transistor structure than to the first type of transistor structure.

10. The electronic device of claim 9, wherein the transistor comprises a channel region and a gate electrode, wherein:

a channel region length of the channel region is longer within the first type of transistor structure as compared to the second type of transistor structure, and the gate electrode has substantially a same gate electrode length within the first and second types of transistor structures.

11. The electronic device of claim 9, wherein the transistor comprises a channel region and a gate electrode, wherein:

a gate electrode length of the gate electrode is shorter within the first type of transistor structure as compared to the second type of transistor structure, and the channel region has substantially a same channel region length within the first and second types of transistor structures.

12. The electronic device of claim 9, wherein the transistor comprises a first portion and a second portion, wherein:

the first portion has a first ratio of a first area occupied by the first type of transistor structure to a second area occupied by the second type of transistor structure;

the second portion has a second ratio of a third area occupied by the first type of transistor structure to a fourth area occupied by the second type of transistor structure; and the first ratio is greater than the second ratio.

13. The electronic device of claim 9, wherein the transistor is a power transistor.

14. An electronic device including a transistor comprising:

a first type of transistor structure having a first channel region length and a first gate electrode length;

a second type of transistor structure having a second channel region length and a second gate electrode length; and a gate pad, wherein:

the first channel region length is longer than the second channel region length, or the first gate electrode length is shorter than the second gate electrode length, the transistor does not include a shield electrode, the transistor has a first section along a conduction path farther from the gate pad and a second section along the conduction path closer to the gate pad, and a ratio of an area of the first type of transistor structure to an area of the second type of transistor structure within the first section is greater than a ratio of an area of the first type of transistor structure to an area of the second type of transistor structure within the second section.

15. The electronic device of claim 14, wherein the first channel region length is longer than the second channel region length.

16. The electronic device of claim 14, wherein the first gate electrode length is shorter than the second gate electrode length.

17. The electronic device of claim 14, wherein the transistor includes a first gate electrode and a second gate electrode, wherein:

the first gate electrode is within the first and second types of transistor structures, and the second gate electrode is within one of the first and second types of transistor structures and does not include the other of the first and second types of transistor structures.

18. An electronic device comprising:

a low-side transistor having a first gate electrode, a first portion, a second portion, a first type of transistor structure, and a second type of transistor structure; and a high-side transistor, wherein a source of the high-side transistor is coupled to a drain of the low-side transistor, wherein:

along the first gate electrode, the first portion of the low-side transistor has a first gate-to-drain capacitance and a first gate-to-source capacitance, along the first gate electrode, the second portion of the low-side transistor has a second gate-to-drain capacitance and a second gate-to-source capacitance, a ratio of the first gate-to-drain capacitance to the first gate-to-source capacitance is less than a ratio of the second gate-to-drain capacitance to the second gate-to-source capacitance, within the low-side transistor, the first type of transistor structure has a longer channel region length or a shorter gate electrode length as compared to the second type of transistor structure, the high-side transistor has a substantially uniform channel region length and a substantially uniform gate electrode length, the low-side transistor has a low-side gate-to-drain capacitance, and the high-side transistor has a high-side gate-to-drain capacitance that is greater than the low-side gate-to-drain capacitance.

19. An electronic device including:

a transistor that does not include a shield electrode, wherein the transistor comprises:

a first type of transistor structure including a gate electrode within a first trench, wherein the gate electrode of the first type of transistor structure has a first gate electrode length; and a second type of transistor structure including a gate electrode within the first trench or a second trench spaced apart from the first trench, wherein the gate electrode of the second type of transistor structure has a second gate electrode length, wherein:

the first gate electrode length is shorter than the second gate electrode length, the first type of transistor structure has a first channel region length, the second type of transistor structure has a second channel region length, and the first channel region length is longer than the second channel region length.

* * * * *